United States Patent [19]

Kuroda

[11] Patent Number: 6,001,698

[45] Date of Patent: Dec. 14, 1999

[54] MOS TRANSISTOR AND FABRICATION PROCESS FOR THE SAME

[75] Inventor: Hideaki Kuroda, Kanagawa, Japan

[73] Assignee: Sony Corporation, Tokyo, Japan

[21] Appl. No.: 08/842,655

[22] Filed: Apr. 15, 1997

[30] Foreign Application Priority Data

Apr. 30, 1996  [JP]  Japan ..................................... 8-108838

[51] Int. Cl.$^6$ ............................................... H01L 21/336
[52] U.S. Cl. .......................................... 438/303; 438/305
[58] Field of Search .................................. 438/565, 303, 438/305, 295, 296, 532

[56] References Cited

U.S. PATENT DOCUMENTS

| | | |
|---|---|---|
| 5,494,857 | 2/1996 | Cooperman et al. . |
| 5,576,574 | 11/1996 | Hong . |
| 5,670,401 | 9/1997 | Tseng . |
| 5,674,774 | 10/1997 | Pasch et al. . |
| 5,688,700 | 11/1997 | Kao et al. . |
| 5,731,239 | 3/1998 | Wong et al. . |
| 5,780,349 | 7/1998 | Naem . |
| 5,786,256 | 7/1998 | Gardner et al. . |

FOREIGN PATENT DOCUMENTS 7-283326  10/1995  Japan .

*Primary Examiner*—Richard Booth
*Assistant Examiner*—Jonathan Hack
*Attorney, Agent, or Firm*—Ronald P. Kananen; Rader, Fishman & Grauer

[57] ABSTRACT

Disclosed is a MOS transistor and a fabrication process for the MOS transistor. Each gate electrode pattern made of silicon is formed on a gate oxide film formed on a silicon base body. An impurity is doped in the silicon base body using the gate electrode patterns as a mask, followed by activation of the impurity thus doped, to form diffusion layers in a surface layer of the silicon base body. An interlayer insulating film is formed in such a manner as to cover the gate electrode patterns. An upper portion of the interlayer insulating film is removed to expose the upper portion of each gate electrode pattern. The gate electrode pattern thus exposed is removed by selective etching. After that, a recessed portion formed by removal of each gate electrode pattern is embedded with a metal material, to form a CMOS transistor.

9 Claims, 7 Drawing Sheets

FIG. IA
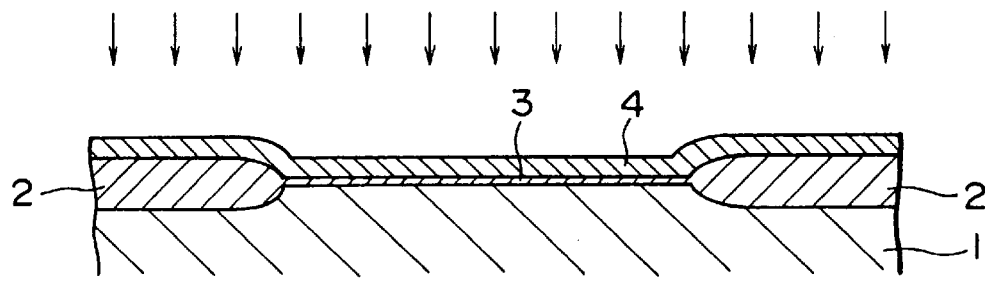
FIG. IB
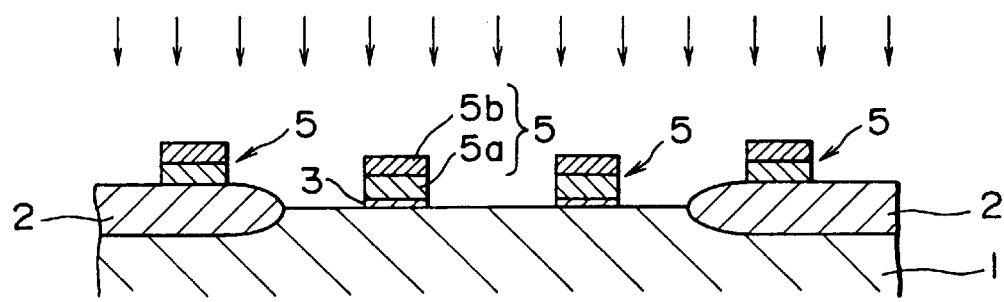
FIG. IC
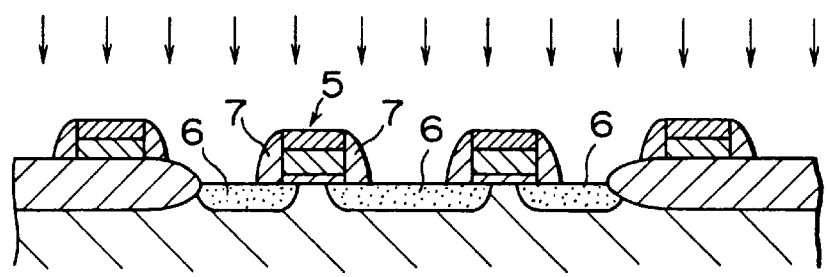
FIG. ID
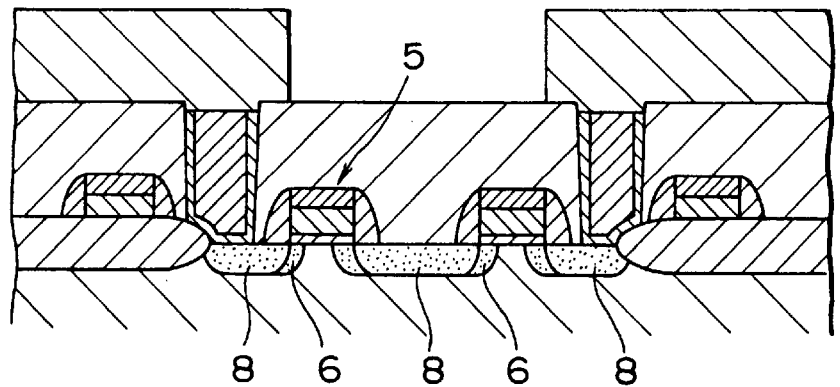

MOS TRANSISTOR AND FABRICATION PROCESS FOR THE SAME

BACKGROUND OF THE INVENTION

1. Field of the Invention

The present invention relates to a fabrication process for a MOS transistor, and a fabrication process for a CMOS transistor using the above process.

2. Description of Related Art

A surface channel type transistor is easily controlled by an electric field of a gate electrode because a current flows along the surface of a silicon substrate, and therefore, it is superior in switching characteristic to an embedded channel type transistor. In other words, the surface channel type transistor can reduce an OFF current as compared with the embedded channel type transistor. For this reason, to meet a requirement to reduce a current consumption, each of an Nch transistor and a Pch transistor has come to be of a surface channel type.

Incidentally, a CMOS transistor having an Nch transistor and a Pch transistor each of which is of a surface channel type, is generally fabricated in accordance with processing steps shown in FIGS. 1A to 1D and FIG. 2. FIGS. 1A to 1D are sectional views taken along the direction perpendicular to the length direction of a gate electrode, in which only one of an Nch transistor region and a Pch transistor region is illustrated; and FIG. 2 is a sectional view taken along the direction parallel to the length direction of the gate electrode.

The related art fabricating process for a CMOS transistor will be described with reference to FIGS. 1A to 1D and FIG. 2. As shown in FIG. 1A, element isolation regions 2 are formed on a silicon substrate 1 by LOCOS, to isolate an Nch transistor region (NchTr) from a Pch transistor (PchTr) as shown in FIG. 2. Next, as shown in FIG. 1A, a gate oxide film 3 is formed on the silicon substrate 1, and a Si film 4 made of crystalline or amorphous pure silicon (doped with no impurity) is deposited on the gate oxide film 2. Subsequently, an N-type impurity and a P-type impurity are doped on the NchTr side and the PchTr side shown in FIG. 2 by ion implantation respectively, to give the Si film 4 in each region a conductivity of a type corresponding to that of transistors to be formed in the region.

A film (not shown) made of tungsten silicide ($WSi_x$) is formed on the Si film 4, followed by patterning of the film and Si film 4, to form gate electrodes 5 each having a polycide structure composed of a silicon portion 5a and a metal silicide portion 5b as shown in FIG. 1B. Then, an N-type impurity and a P-type impurity are doped on the NchTr side and the PchTr side by ion implantation using these gate electrodes 5 as a mask respectively, followed by activation of these impurities by heat treatment, to form LDD diffusion layers 6 corresponding to the transistors to be formed in each region as shown in FIG. 1C.

Next, side walls 7 are formed on both the sides of each gate electrode 5. An N-type impurity and a P-type impurity are doped on the NchTr side and PchTr side by ion implantation using the side walls 7 and the gate electrodes 5 as a mask respectively, followed by activation of these impurities thus doped by heat treatment, to form diffusion layers 8 as source/drain regions corresponding to the transistors to be formed in each region as shown in FIG. 1D.

Incidentally, in the above-described related art fabrication process for a CMOS transistor, as described above, to make lower the resistance of the gate electrode 5, and to electrically connect the gate electrodes 5 in the VchTr and the PchTr to each other, the gate electrode 5 is configured to be of the polycide structure composed of the silicon portion 5a and the metal silicide portion 5b.

Such a polycide structure of the gate electrode, however, presents a problem. That is, by the heat treatment performed to activate the doped impurities for forming the LDD diffusion layers 6 and the diffusion layers 8 after formation of the gate electrodes 5, the impurities in the silicon portions 5a of the gate electrodes 5 are easily mutually diffused through the metal silicide portions 5b as shown in FIG. 3, and such mutual diffusion of the impurities reduces the concentration of the impurity in the silicon portion 5a of each gate electrode 5, to change the work function of the gate electrode, thus rendering variable the threshold voltage of the transistor.

OBJECT AND SUMMARY OF THE INVENTION

An object of the present invention is to provide a fabrication process for a CMOS transistor, which is intended to solve a problem resulting from the mutual diffusion of impurities; and a fabrication process for a MOS transistor which is applied to the above fabrication process for a CMOS transistor.

To achieve the above object, according to a first aspect of the present invention, there is provided a fabrication process for a MOS transistor including:

a first step of forming a gate electrode pattern made of silicon on a gate oxide film formed on a silicon substrate;

a second step of doping an impurity in the silicon substrate using the gate electrode pattern as a mask, followed by activation of the doped impurity, to form a diffusion layer in a surface layer of the silicon substrate;

a third step of forming an interlayer insulating film in such a manner as to cover the gate electrode pattern;

a fourth step of removing an upper portion of the interlayer insulating film for exposing an upper portion of the gate electrode pattern;

a fifth step of removing the exposed portion of the gate electrode pattern by selective etching; and a sixth step of embedding a metal material in a recessed portion formed by removal of the exposed portion of the gate electrode pattern by etching.

According to this fabricating process, after formation of each diffusion layer in a surface layer of a silicon substrate by activation of a doped impurity, each gate electrode pattern having once formed is removed and a metal material is embedded in a recessed portion formed by removal of the gate electrode pattern, and accordingly, the gate electrode formed of the metal material is never affected by heat treatment accompanied by formation of the diffusion layer.

According to a second aspect of the present invention, there is provided a fabrication process for a MOS transistor, including:

a first step of forming a gate electrode pattern on a gate oxide film formed on a silicon base body, the gate electrode pattern formed by stacking silicon, a material having an etching selection ratio to silicon, and silicon in this order from the gate oxide film side;

a second step of doping an impurity in the silicon base body using the gate electrode pattern as a mask, followed by activation of the doped impurity, to form a diffusion layer in a surface layer of the silicon base body;

a third step of forming an interlayer insulating film in such a manner as to cover the gate electrode pattern;

a fourth step of removing an upper portion of the interlayer insulating film to expose an upper portion of the gate electrode pattern;

a fifth step of removing the silicon forming the upper layer of the gate electrode pattern thus exposed by selective etching;

a sixth step of doping an impurity in the silicon of the lower layer of the gate electrode pattern, followed by activation of the doped impurity; and a seventh step of embedding a metal material in a recessed portion formed by removal of the silicon of the upper layer of the gate electrode pattern by etching;

wherein the process further includes, between the fifth step and the seventh step, a step of removing the material having an etching selection ratio to silicon of the gate electrode pattern by etching.

According to this fabricating process, after formation of each diffusion layer in a surface layer of a silicon base body by activation of a doped impurity, the silicon of an upper layer of each gate electrode pattern having been formed is removed by selective etching, followed by doping of an impurity in the silicon of a lower layer of the gate electrode pattern and activation of the doped impurity, and a metal material is embedded in a recessed portion formed by removal of the silicon of the upper layer of the gate electrode pattern, and accordingly, the gate electrode made of the metal material and the silicon of the lower layer of the gate electrode pattern is never affected by heat treatments accompanied by formation of the diffusion layer and diffusion of the impurity in the silicon of the lower layer of the gate electrode pattern.

Further, since the doping of the impurity in the silicon of the lower layer of the gate electrode pattern and the diffusion of the impurity do not exert any effect on the characteristics of the gate electrode, the conducting type of the impurity can be freely selected.

According to a third aspect of the present invention, there is provided a fabrication process for a CMOS transistor, including:

a first step of forming a PMOS region and an NMOS region on a silicon base body, and forming a gate oxide film on the surface of the silicon base body in each of the PMOS and NMOS regions;

a second step of forming a gate electrode pattern made of silicon on the gate oxide film formed on the silicon base body in each of the regions;

a third step of covering the NMOS region with a resist layer and doping a P-type impurity in the silicon base body in the PMOS region using the resist layer and the gate oxide pattern as a mask, covering the PMOS region with a resist layer and doping an N-type impurity in the silicon base body in the NMOS region using the resist layer and the gate electrode pattern as a mask, and activating the impurities thus doped, thereby forming diffusion layers in surface layers of the silicon base body in the NMOS and PMOS regions respectively;

a fourth step of forming an interlayer insulating film in such a manner as to cover the gate electrode patterns in the NMOS and PMOS regions;

a fifth step of removing an upper portion of the interlayer insulating film to expose an upper portion of each of the gate electrode patterns;

a sixth step of removing the exposed portion of each of the gate electrode patterns by selective etching; and a seventh step of embedding a metal material in a recessed portion formed by removal of the exposed portion of each of the gate electrode patterns by etching.

According to this fabricating process, after formation of a P-type diffusion layer in a PMOS region of a silicon base body and an N-type diffusion layer in an NMOS region of the silicon base body by activation of doped impurities, each gate electrode pattern having been formed is removed and a metal material is embedded in a recessed portion formed by removal of the gate electrode pattern to form a gate electrode of the metal material, and accordingly, there can be obtained a CMOS transistor having gate electrodes each being never affected by heat treatment accompanied by formation of the diffusion layer.

According to a fourth aspect of the present invention, there is provided a fabrication process for a CMOS transistor, including:

a first step of forming a PMOS region and an NMOS region on a silicon base body and forming a gate oxide film on the surface of the silicon base body in each of the regions;

a second step of forming a gate electrode pattern on the gate oxide film formed on the surface of the silicon base body in each of the regions, the gate electrode pattern being from by stacking silicon doped with no impurity, a material having an etching selection ratio to silicon, and silicon in this order from the gate oxide film side;

a third step of covering the NMOS region with a resist layer and doping a P-type impurity in the silicon base body in the PMOS region using the resist layer and the gate oxide pattern as a mask, covering the PMOS region with a resist layer and doping an N-type impurity in the silicon base body in the NMOS region using the resist layer and the gate electrode pattern as a mask, and activating impurities thus doped, thereby forming diffusion layers in surface layers of the silicon base body in the NMOS and PMOS regions respectively;

a fourth step of forming an interlayer insulating film in such a manner as to cover the gate electrode patterns in the PMOS and NMOS regions;

a fifth step of removing an upper portion of the interlayer insulating film to expose an upper portion of each of the gate electrode patterns;

a sixth step of removing the silicon of the upper layer of the gate electrode pattern thus exposed;

a seventh step of doping a P-type impurity in the silicon of the lower layer of the gate electrode pattern in the PMOS region, doping an N-type impurity in the silicon of the lower layer of the gate electrode pattern in the NMOS region, and activating the impurities thus doped; and an eighth step of embedding a metal material in a recessed portion formed by removal of the silicon of the upper layer of each of the gate electrode patterns by etching;

wherein the process further includes, between the sixth step and the eighth step, a step of removing the material having an etching selection ratio to silicon of each of the gate electrode patterns by etching.

According to this fabricating process, after formation of a P-type diffusion layer in a PMOS region of a silicon base body and an N-type diffusion layer in an NMOS region of the silicon base body by activation of doped impurities, silicon of an upper layer of each gate electrode pattern having once formed is removed by selective etching, followed by doping an impurity having a conducting type corresponding to that of transistors to be formed in each region in the silicon of the lower layer of the gate electrode pattern and activation of the impurity, and a metal material is embedded in a recessed portion formed by removal of the silicon of the upper layer of the gate electrode pattern to form a gate electrode of the metal material and the silicon of the lower layer of the gate electrode pattern, and accordingly, there can be obtained a CMOS transistor having gate electrodes each being never affected by heat treatments accompanied by formation of the diffusion layer and diffusion of the impurity in the silicon of the lower layer of the gate electrode pattern.

BRIEF DESCRIPTION OF THE DRAWINGS

FIGS. 1A to 1D are sectional views of an essential portion of a CMOS transistor illustrating a fabrication process for the CMOS transistor according to a related art in the order of fabrication steps;

DETAILED DESCRIPTION OF THE PREFERRED EMBODIMENTS

Figure 2:
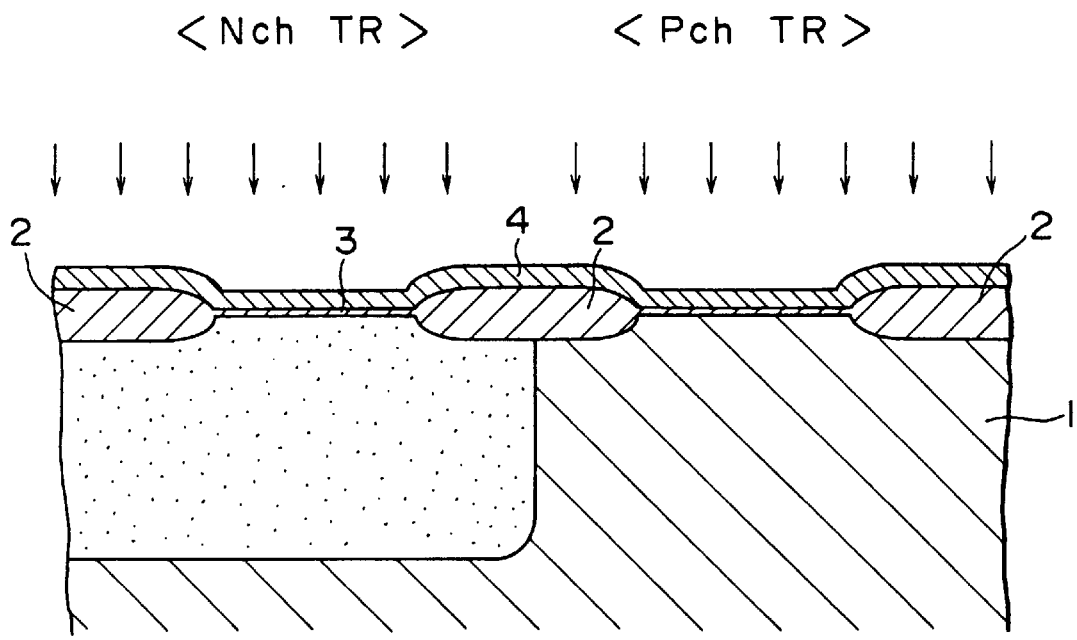
FIG. 2 is a sectional view of an essential portion of the CMOS transistor illustrating the fabrication process for the CMOS transistor according to the related art shown in FIGS. 1A and 1D.
Figure 3:
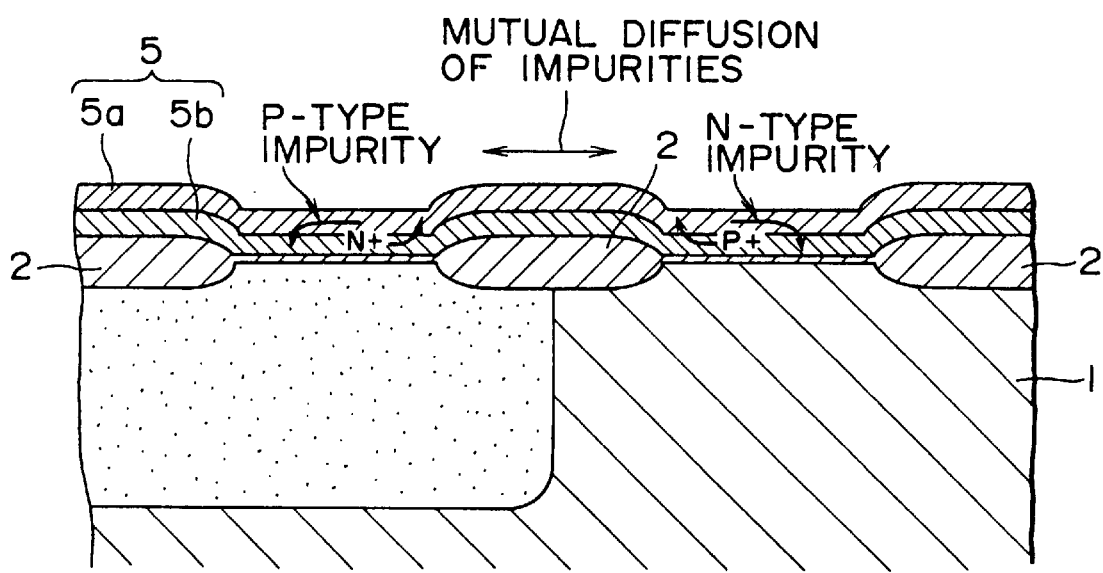
FIG. 3 is a sectional view of an essential portion of a CMOS transistor illustrating a problem of the fabrication process for the CMOS transistor according to the related art.

Hereinafter, the present invention will be described in detail with reference to the accompanying drawings.

FIGS. 4A to 4G are view illustrating a first embodiment of a fabrication process for a CMOS transistor according to the present invention, wherein reference numeral 10 indicates a silicon substrate (silicon base body). It is to be noted that both an Nch transistor and a Pch transistor are basically fabricated in the same process in this embodiment, and therefore, only one channel side is shown in cross-section in FIGS. 4A to 4G.

Figure 4A:
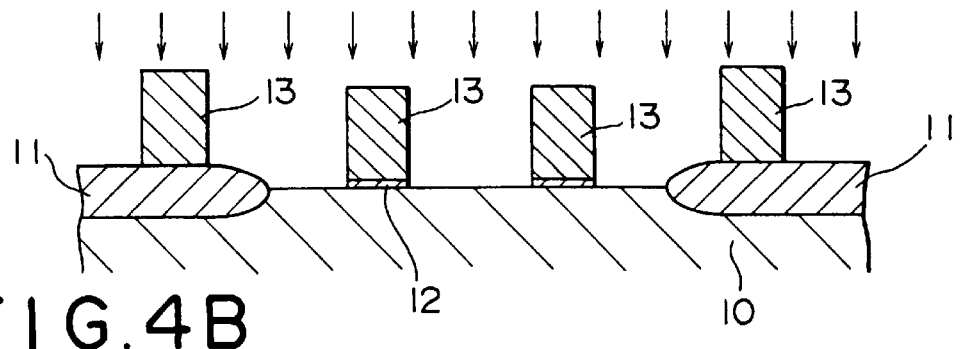
FIGS. 4A to 4G are sectional views of an essential portion of a CMOS transistor illustrating a fabrication process for the CMOS transistor according to a first embodiment of the present invention in the order of fabrication steps.

In this embodiment, as shown in FIG. 4A, element isolation regions 11 are formed on a silicon substrate 10 by LOCOS to isolate an Nch transistor region (NchTr) from a Pch transistor region (PchTr) as shown in FIG. 2. A gate oxide film 12 is formed on the surface of the silicon substrate 10 in an active region by thermal oxidation, and a Si film (not shown) made of crystalline or amorphous pure silicon (doped with no impurity) is deposited on the gate oxide film 12 to a thickness of several hundred nm.

Figure 4B:
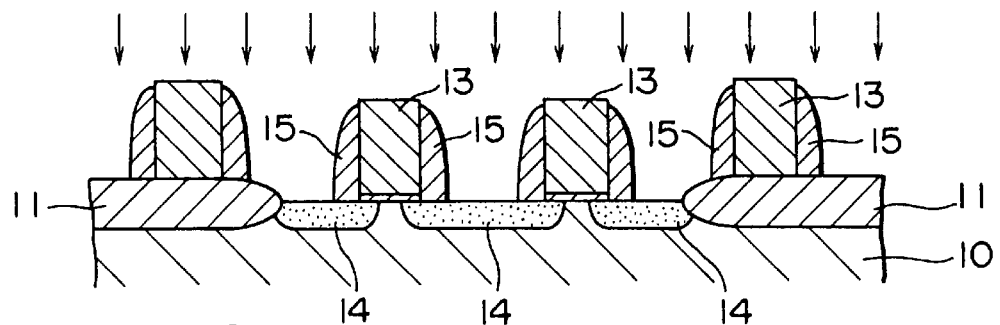

The Si film is patterned by lithography and etching, to form gate electrode patterns 13 shown in FIG. 4A. Subsequently, an N-type impurity and a P-type impurity are doped on a NchTr side (not shown) and a PchTr (not shown) side by ion implantation using the gate electrode patterns 13 as a mask respectively, followed by activation of the impurities thus doped by heat treatment, to form LDD diffusion layers 14 having a conducting type corresponding to that of transistors to be formed in each region, as shown in FIG. 4B.

Figure 4C:
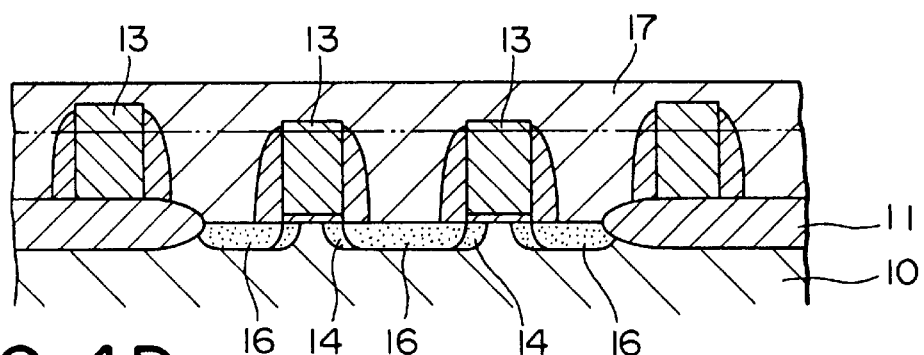

Next, SiN or $SiO_2$ is deposited by CVD on the silicon substrate 10 to a thickness of several ten nm to one hundred and several ten nm in such a manner as to cover the gate electrode patterns 13, followed by etching-back, to form side walls 15 on both sides of each gate electrode 13. An N-type impurity and a P-type impurity are doped on the NchTr side and the PchTr side by ion implantation using the side walls 13 and the gate electrodes 13 as a mask, followed by activation of the impurities thus doped by heat treatment, to diffusion layers 16 as source/drain regions corresponding to the transistors to be formed in each region as shown in FIG. 4C. In the above ion implantation, As, P (phosphorus) or the like is used as the N-type impurity doped on the NchTr side, the implantation energy is selected in a range of about 10 to 80 keV, and the dose is selected in a range of about $10^{14}$ to $10^{16}$ ions/cm$^2$. On the other hand, B, $BF_2^+$ or the like is used as the P-type impurity doped on the PchTr side, the implantation energy is selected in a range of about 10 to 80 keV, and the dose is selected in a range of about $10^{14}$ to $10^{16}$ ions/cm$^2$.

Next, BPSG (borophosphosilicate glass) is deposited by CVD to a thickness of about several hundred nm in such a manner as to cover the gate electrode patterns 13 and the side walls 15, followed by a reflow process by heating at a temperature of about 800 to 900° C. for planarizing the BPSG film, to form an interlayer insulating film 17 shown in FIG. 4C.

An upper portion of the interlayer insulating film 17 is removed by CMP (chemical-mechanical polishing) or RIE (reactive ion etching) up to a position, for example, shown by a two-dot chain line in FIG. 4C, to expose the upper portion of the gate electrode patterns 13. Here, the upper portion of the interlayer insulating film 17 is removed by a method of experimentally determining a polishing rate or an etching rate at which the interlayer insulating film 17 is polished or etched by CMP or RIE under specific conditions, and controlling the polishing time or etching time on the basis of a relationship between the polishing rate or etching rate and the thickness of the interlayer insulating film 17 experimentally formed. Alternatively, there may be adopted a method of previously preparing a pattern for determining termination of polishing or etching, which is the same in material as the gate electrode pattern 13 and is formed on the silicon substrate 10 in the same manner as that for the gate electrode pattern 13, and optically detecting such a pattern exposed accompanied by polishing or etching, thereby determining the termination of the polishing or etching.

Figure 4D:
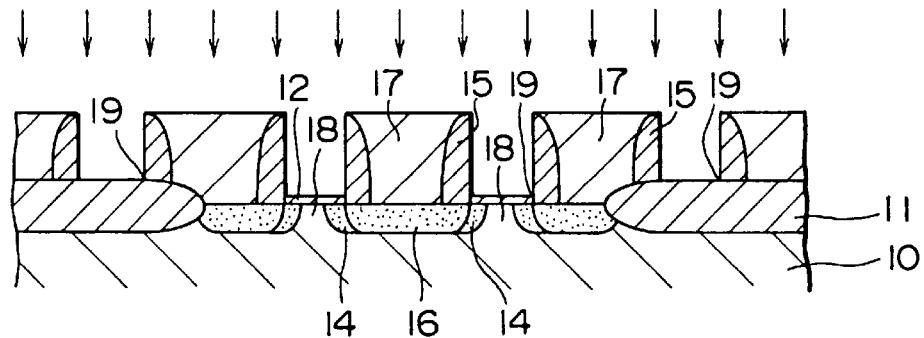

Each gate electrode pattern 13 thus exposed is selectively etched as shown in FIG. 4D. In this etching, there is used an etchant capable of exhibiting a high etching selectivity between $SiO_2$ (BPSG) forming the interlayer insulating film 17 and SiN or $SiO_2$ forming the side wall 15. Concretely, there may be adopted dry etching using HBr and $Cl_2$, or $Cl_2$ as an etching gas, or plasma etching using $SF_6$ as a plasma etchant, and more preferably, wet etching using alkali such as KOH or ammonia.

Next, to adjust the impurity concentration in the surface layer of the silicon substrate 10 and to prevent punch-through of transistors to be obtained, the following process of ion implantation (doping) of impurities is performed. Namely, the PchTr side is covered with a resist (not shown) and ions of B or $BF_2$ are implanted on the NchTr side using the resist as a mask at an implantation energy of about 10–50 keV in a dose of about $10^{11}$–$10^{13}$ ions/cm$^2$; and similarly, the NchTr side is covered with a resist (not shown) and ions of As or P are implanted on the PchTr side using the resist as a mask at an implantation energy of about 10–70 keV in a dose of about $10^{11}$–$10^{13}$ ions/cm$^2$.

The impurities thus doped are then activated by lamp anneal at a temperature of 700 to 1000° C. Thus, the impurity doped on each of the PchTr side and the PchTr side is substantially diffused by activation only into channel portions 18 in each of the PchTr side and the PchTr side, and consequently, it becomes possible to prevent the impurity concentration of the silicon substrate 10 from being increased at the junction portions, and hence to prevent the increased junction leak and also the increased junction capacity.

Figure 4E:
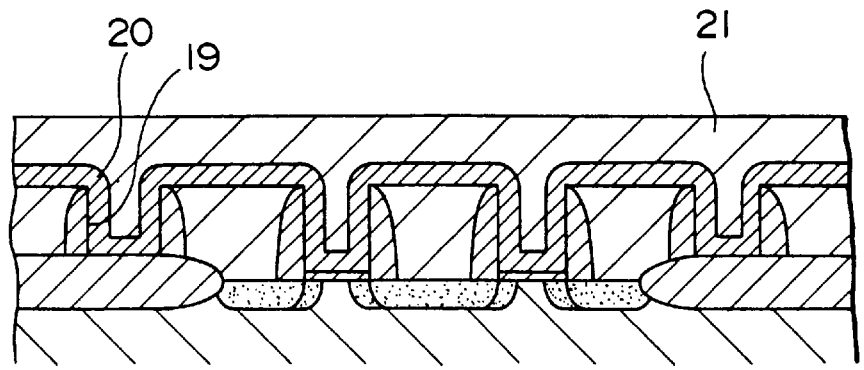

Next, as shown in FIG. 4E, a metal material 20, for example, a high melting point metal such as tungsten or molybdenum is embedded in a groove-like recessed portion 19 formed by removal of each gate electrode pattern 13 by etching. The metal material 20 can be embedded by various methods such as sputtering or CVD, and in this embodiment, the high melting point metal is embedded in the recessed portion 19 by sputtering to a thickness of several ten nm to several hundred nm. Subsequently, SOG (spin-on-glass) 21 is further embedded in the recessed portion 19 which has been embedded with the metal material 20. The reason why the SOG 21 is further embedded is that it is difficult to embed the high melting point metal in the groove-like recessed portion 19 by sputtering with a good coverage.

Figure 4F:
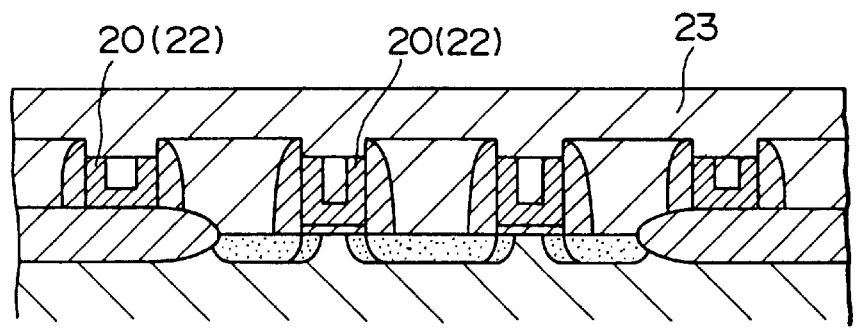

The SOG 21 and the metal material 20 are removed by CMP or etching-back, to leave the metal material 20 in each recessed portion 19 as shown in FIG. 4F. The metal material 20 thus embedded in the recessed portion 19 is taken as a gate electrode 22. Subsequently, an interlayer insulating film 23 made of BPSG is formed by CVD in such a manner as to cover the gate electrodes 22.

Figure 4G:
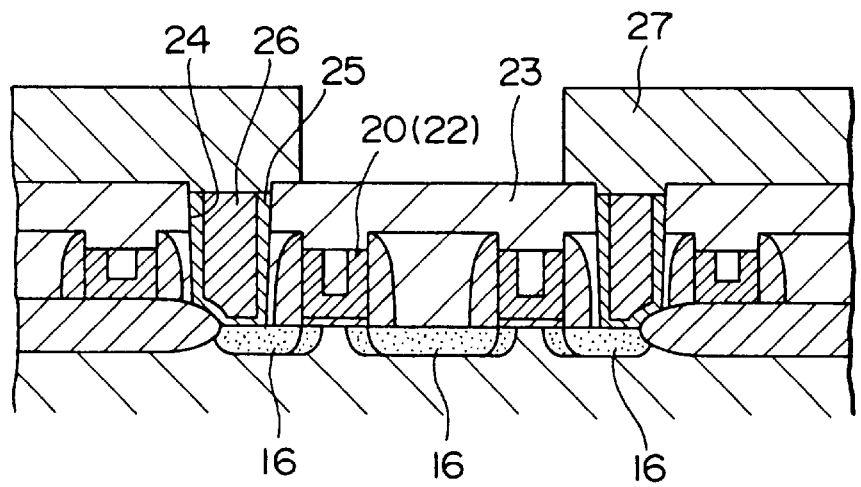

Next, contact holes 24 each communicated to the diffusion layers 16 are formed in the interlayer insulating film 23 by lithography and etching as shown in FIG. 4G. After that, an adhesion layer 25 having a stacked structure of Ti and TiN is formed in each contact hole 24, and then the contact hole 24 is embedded with a tungsten plug 26 via the adhesion layer 25. An interconnection pattern 27 made of AlCu, Ti, TiN, Cu, or the like is then formed on the interlayer insulating film 23 in such a manner as to be connected to the tungsten plugs 26, to thus obtain a CMOS transistor.

In this fabricating process, after formation of each P-type diffusion layer 16 on the PMOSTr side of the silicon substrate 10 and each N-type diffusion layer 16 on the NMOS Tr side, each gate electrode pattern 13 having been formed is removed and the metal material 20 is embedded in the groove-like recessed portion 19 formed by the removal of the gate electrode pattern 13 to form the gate electrode 22. Consequently, the gate electrode 22 thus obtained is never affected by heat treatment accompanied by formation of the diffusion layers 16, so that there can be fabricated a CMOS transistor of a surface channel type, which is capable of eliminating any variation in threshold voltage Vth.

Further, as shown in FIG. 4D, after removal of the gate electrode patterns 13 by selective etching, ion implantation (doping) is performed for adjustment of the impurity concentration of the surface layer of the silicon substrate 10 and prevention of punch-through of transistors to be obtained, so that it becomes possible to prevent the impurity concentration of the silicon substrate 10 from being increased at the junction portions and hence to prevent the increased junction leak and the junction capacity.

Although the Si film forming the gate electrode patterns 13 is made of pure silicon in this embodiment, the present invention is not limited thereto. For example, the Si film may be made of silicon doped with an impurity, and in this case, since the processing performance of the Si film is improved, the gate electrode patterns 13 can be easily formed.

Next, a second embodiment of the fabrication process for a CMOS transistor according to the present invention will be described with reference to FIGS. 5A to 5G. In this embodiment, as in the previous embodiment, both an Nch transistor and a Pch transistor are basically fabricated in the same process, and therefore, only one channel side is shown in cross-section in FIGS. 5A to 5G.

The second embodiment is different from the first embodiment in the configuration of the gate electrode pattern.

Specifically, in the second embodiment, element isolation regions 11 are formed on a silicon substrate (silicon base body) in the same manner as in the previous embodiment, to isolate an NchTr side from a PchTr side. Then, a gate oxide film 12 is formed on the surface of the silicon substrate 10 in an active region.

Next, polysilicon is deposited on the silicon substrate 10 to a thickness of several ten nm and one hundred and several ten nm in such a manner as to cover the gate oxide film 12, and $SiO_2$ (thickness: several nm) and polysilicon containing no impurity (thickness: several hundred nm) are sequentially deposited thereon. In addition, polysilicon may be replaced with amorphous silicon, and silicon of the upper layer may be doped or not doped with impurity. Also, $SiO_2$ provided between the upper and lower silicon layers may be replaced with a material capable of exhibiting a high etching selection ratio to silicon.

Figure 5A:
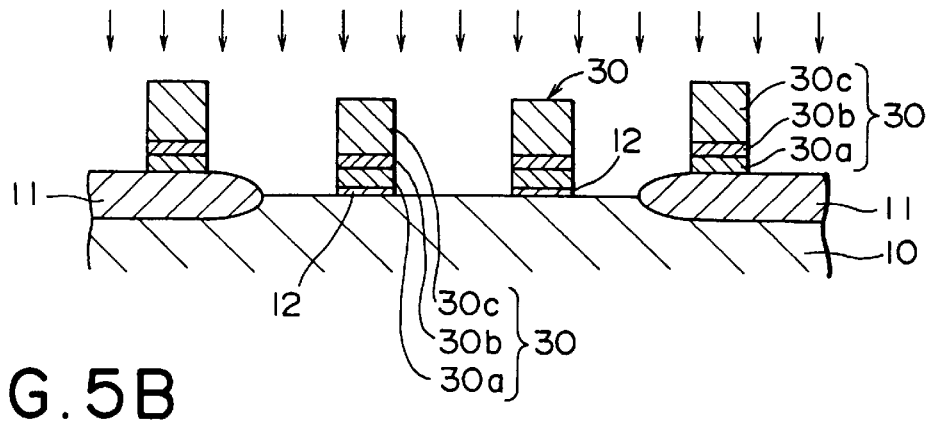
FIGS. 5A to 5G are sectional views of an essential portion of a CMOS transistor illustrating a fabrication process for the CMOS transistor according to a second embodiment of the present invention in the order of fabrication steps.

A stacked film of polysilicon, $SiO_2$ and polysilicon is patterned by lithography and etching, to form each gate electrode pattern 30 composed of a lower layer silicon film 30a, a $SiO_2$ film 30b, and an upper layer silicon film 30c as shown in FIG. 5A.

Figure 5B:
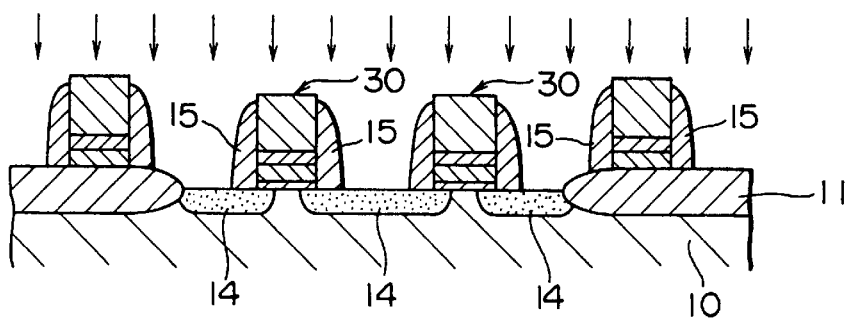

Next, as in the previous embodiment, an impurity is doped in each region by ion implantation, followed by activation by heat treatment, to form LDD diffusion layers 14 as shown in FIG. 5B. Subsequently, as in the previous embodiment, side walls 15 are formed on both sides of each gate electrode pattern 30, and an impurity is doped in each region using the gate electrode patterns 30 and the side walls 15 as a mask, followed by activation, to form diffusion layers 16 shown in FIG. 5C.

Figure 5C:
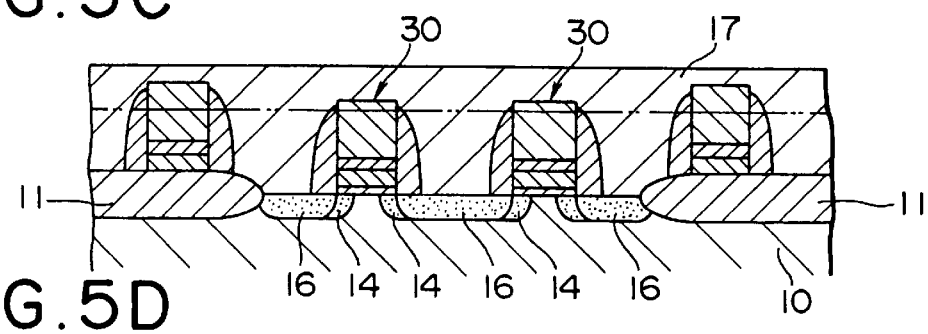
Figure 5D:
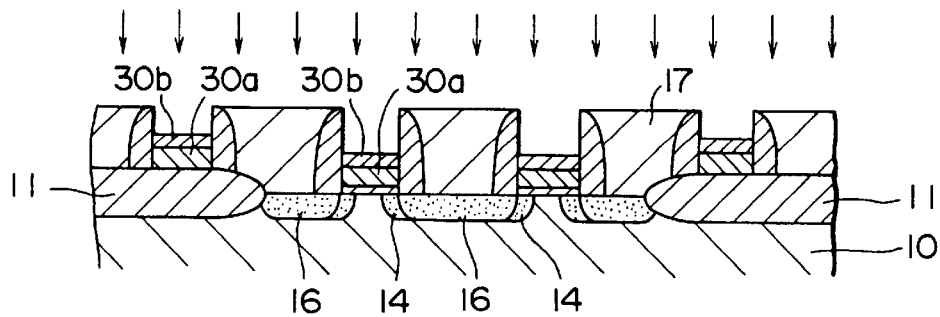

Next, as in the previous embodiment, a BPSG film is formed, followed by planarization, to form an interlayer insulating film 17. An upper portion of the interlayer insulating film 17 is then removed by CMP or RIE up to a position shown by a two-dot chain line of FIG. 5C, to expose the upper layer silicon film 30c of each gate electrode pattern 30. The upper layer silicon film 30c of the gate electrode pattern 30 thus exposed is removed by selective etching as shown in FIG. 5D. In addition, as in the previous embodiment, this etching is performed using an etchant capable of exhibiting a high etching selectivity among $SiO_2$ (BPSG) forming the interlayer insulating film 17, SiN or $SiO_2$ forming the side wall 15, and $SiO_2$ forming the $SiO_2$ film 30b of the gate electrode pattern 30.

The PchTr side is covered with a resist (not shown), ions of As or P are doped in the lower layer silicon film 30a of each gate electrode pattern 30 on the NchTr side using the resist as a mask at an implantation energy of about 10–80 keV in a dose of about $10^{15}$–$10^{16}$ ions/cm$^2$; and similarly, the NchTr side is covered with a resist (not shown), ions of $BF_2^+$ are doped in the lower layer silicon film 30*a* of each gate electrode pattern 30 on the PchTr side using the resist as a mask at an implantation energy of about 10–80 keV in a dose of $10^{15}$ to $10^{16}$ ions/cm$^2$. The impurities thus doped are then activated by lamp anneal at a temperature of 900 to 1100° C., so that the lower layer silicon film 30*a* of each gate electrode pattern 30 in each region is given an electric conductivity.

Differently from the doping of an impurity into the lower layer silicon film 30*a*, as in the previous embodiment, ion implantation (doping) is performed for adjustment of the impurity concentration of the surface layer of the silicon substrate 10 and prevention of punch-through of transistors to be obtained. In addition, the ion implantation may be performed before or directly after the doping of an impurity into the lower layer silicon film 30*a*.

The SiO$_2$ film 30*b* of each gate electrode pattern 30 is removed by etching. In this etching, only the SiO$_2$ film 30*b* may be etched by covering a portion other than the SiO$_2$ film 30*b*; however, since the SiO$_2$ film 30*b* is very thin as described above, it may be removed by etching-back of the entire surface of the silicon substrate 10. In addition, this etching may be performed prior to the doping of an impurity into the lower layer silicon film 30*a*.

Figure 5E:
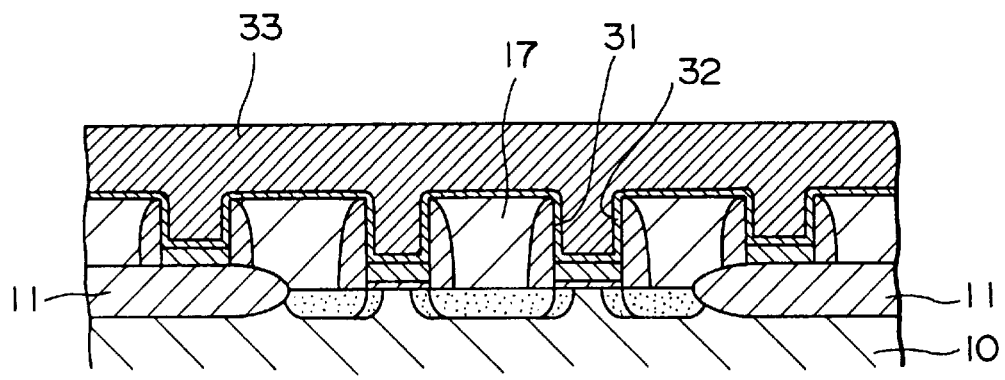

As shown in FIG. 5E, an adhesion film 32 having a stacked structure of Ti and TiN is deposited on the silicon substrate 10 to a thickness of several ten nm to cover the interior of a groove-like recessed portion 31 formed by removal of the upper layer silicon film 30*c* and the SiO$_2$ film 30*b* of each gate electrode pattern 30 by etching. A tungsten W 33 as a metal material is then deposited on the adhesion film 32 by CVD to a thickness of several hundred nm to be embedded in the recessed portion 31. The adhesion film 32 is formed by sequentially forming a Ti film and a TiN film by sputtering, followed by RTA (rapid thermal anneal), or forming a Ti film by sputtering, followed by RTA in an ammonia atmosphere to nitride a surface layer of the Ti film, thereby obtaining the adhesion film 32.

Figure 5F:
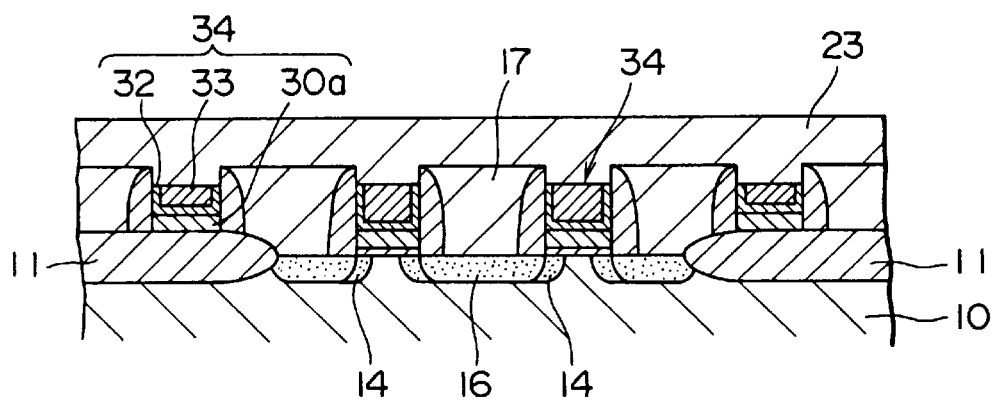

The tungsten 33 and the adhesion film 32 on the interlayer insulating film 17 are removed by CMP or etching-back, to leave the tungsten 33 and the adhesion film 32 in each recessed portion 31 as shown in FIG. 5F, so 7that the tungsten film 33, the adhesion layer 32, and the lower layer silicon film 30*a* are taken as a gate electrode 34. Subsequently, an interlayer insulating film 23 made of BPSG is formed by CVD in such a manner as to cover the gate electrodes 34.

Figure 5G:
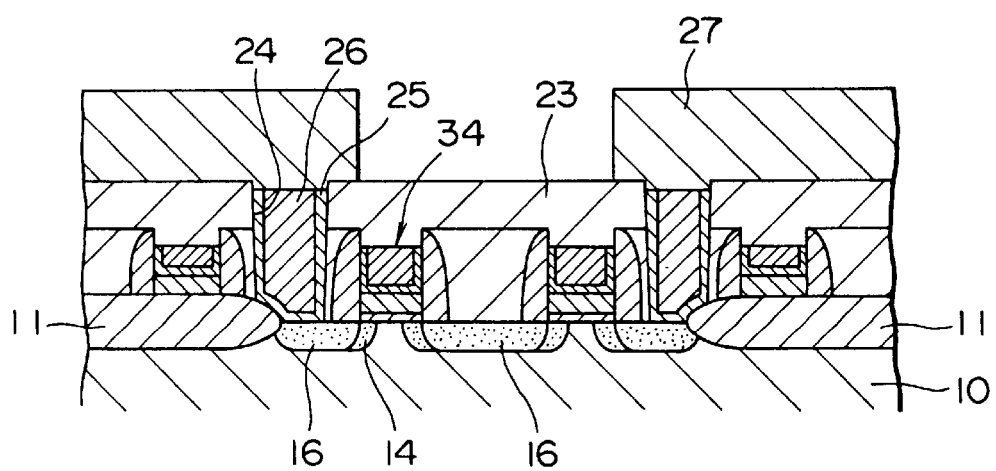

After that, as shown in FIG. 5G, contact holes 24 are formed in the interlayer insulating film 23 in the same manner as in the previous embodiment, and they are each embedded with tungsten plugs 26. An interconnection pattern 27 is then formed in such a manner as to be connected to the tungsten plugs 26, to thus obtain a CMOS transistor.

In this fabricating process, after formation of each P-type diffusion layer 16 on the PMOSTr side of the silicon substrate 10 and each N-type diffusion layer 16 on the NMOSTr side thereof, the upper layer silicon film 30*c* of each gate electrode pattern 30 having been formed is removed, and the groove-like recessed portion 31 formed by removal of the upper layer silicon film 30*c* is embedded with the tungsten 33, so that the tungsten 33 and the lower silicon film 30*a* are taken as the gate electrode 34. As a result, the gate electrode 34 thus obtained is never affected by heat treatments accompanied by formation of the diffusion layers 16 and diffusion of the impurities to the lower silicon films 30*a*, so that there can be obtained a CMOS transistor of a surface channel type, which is capable of eliminating any variation in threshold voltage Vth.

Further, as in the previous embodiment, after removal of the upper layer silicon film 30*a* of each gate electrode pattern 30 by selective etching, ion implantation (doping) is performed for adjustment of the impurity concentration of the surface layer of the silicon substrate 10 and prevention of punch-through of transistors to be obtained, so that it becomes possible to prevent the impurity concentration of the silicon substrate 10 from being increased at the junction portions and hence to prevent the increased junction leak and the increased junction capacity.

Next, a third embodiment of the fabrication process for a CMOS transistor according to the present invention will be described with reference to FIGS. 6A to 6D. In this embodiment, as in the previous embodiment, both an Nch transistor and a Pch transistor are basically fabricated in the same process, and therefore, only one channel side is shown in cross-section in FIGS. 6A to 6D.

Figure 6A:
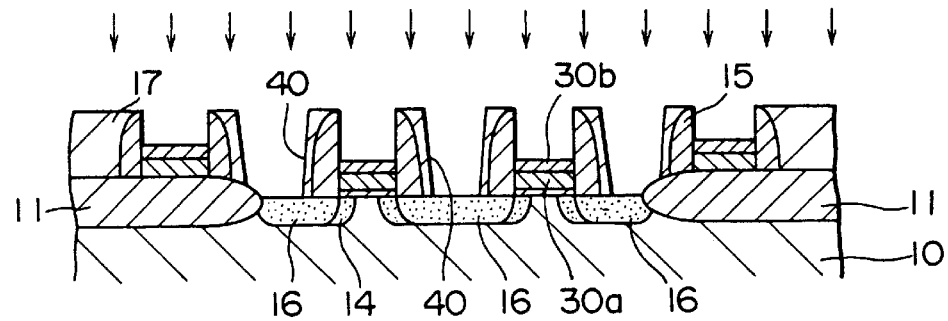
FIGS. 6A to 6D are sectional views of an essential portion of a CMOS transistor illustrating a fabrication process for the CMOS transistor according to a third embodiment of the present invention in the order of fabrication steps.

The third embodiment is different from the second embodiment in that after removal of an upper layer silicon film 30*a* of each gate electrode pattern 30, an interlayer insulating film 17 is etched prior to doping of an impurity into the lower layer silicon film 30*a*, to form a second recessed portion 40 communicated to a diffusion layer 16 as shown in FIG. 6A.

Specifically, in the third embodiment, as in the second embodiment described with reference to FIGS. 5A to 5C, there are sequentially formed gate electrode patterns 34, each being formed of a lower layer silicon film 30*a*, a SiO$_2$ film 30*b* and an upper layer silicon film 30*c*; LDD diffusion layers 14; side walls 15; diffusion layers 16; and an interlayer insulating film 17. Subsequently, an upper portion of the interlayer insulating film 17 is removed by polishing or etching-back, to expose the upper portion of the upper layer silicon film 30*a* of each gate electrode pattern 30, and the exposed upper layer silicon film 30*a* is removed by etching.

Next, as shown in FIG. 6A, the interlayer insulating film 17 is opened in groove-like shapes by lithography and etching, to form second recessed portions 40 communicated to the diffusion layers 16. Here, the second recessed portion 40 has a planar shape extending along the direction where the diffusion layer 16 extends.

As in the second embodiment, an impurity is doped on each of the PchTr side and NchTr side using a resist (not shown) as a mask by ion implantation. At this time, since each second recessed portion 40 is formed in the interlayer insulating film 17 differently from the first embodiment, the impurity is implanted not only into the lower layer silicon film 30*a* of each silicon gate electrode pattern 30 but also into each diffusion layer 16 through the second recessed portion 40.

Like the second embodiment, the SiO$_2$ film 30*b* of the gate electrode pattern 30 is removed by etching.

Figure 6B:
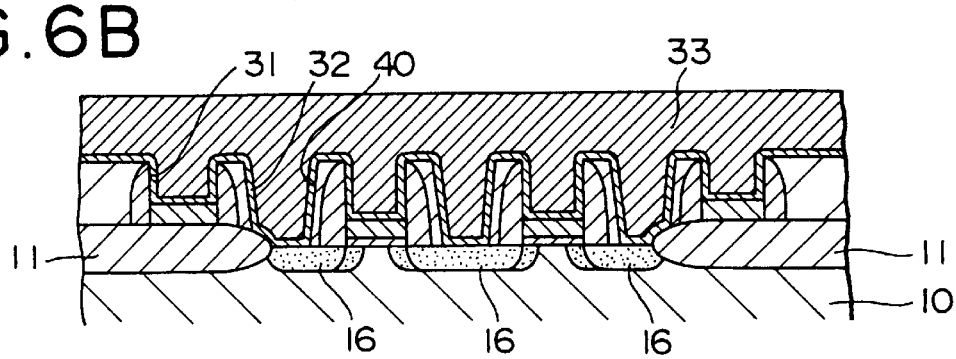

As shown in FIG. 6B, an adhesion film 32 having a stacked structure of Ti and TiN is formed on the silicon substrate 10, to cover the interiors of the recessed portions 31 and the second recessed portions 40; and tungsten 33 as a metal material is deposited thereon to be embedded in the recessed portions 31 and the second recessed portions 40.

Figure 6C:
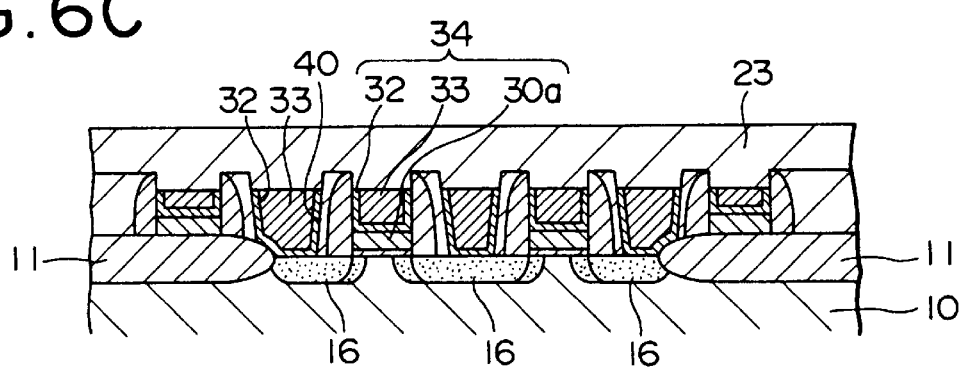

Next, as in the second embodiment, the tungsten 33 and the adhesion film 32 on the interlayer insulating film 17 are removed by CMP or etching-back, to leave the tungsten 33 and the adhesion film 32 in the recessed portions 31 and the second recessed portions 40 as shown in FIG. 6C. The tungsten film 33, the adhesion film 32 and the lower layer silicon film 30a are taken as a gate electrode 34. Subsequently, an interlayer insulating film 23 made of BPSG is formed by CVD in such a manner as to cover the gate electrodes 34.

Figure 6D:
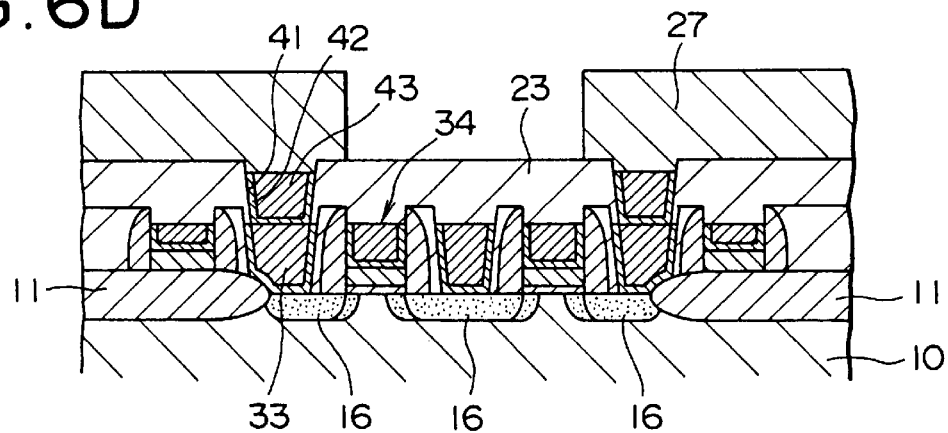

After that, as shown in FIG. 6D, contact holes 41 communicated to the tungsten 33 remaining in the second recessed portions 40, and contact holes (not shown) communicated to the gate electrodes 34 are simultaneously formed by lithography and etching, and these contact holes are embedded with tungsten plugs 43 via the adhesion layers 42. An interconnection pattern 27 is then formed in such a manner as to be connected to the tungsten plugs 43, to thus obtain a CMOS transistor.

In this fabricating process, after formation of each diffusion layer 16, the upper layer silicon film 30c of each gate electrode pattern 30 having been formed is removed, and the recessed portion 31 thus obtained is embedded with the tungsten 33, to form the gate electrode 34 of the tungsten 33 and the lower layer silicon film 30a, and accordingly the gate electrode 34 is never affected by heat treatments accompanied by formation of the diffusion layers 16 and the diffusion of the impurity to the lower layer silicon films 30a. This makes it possible to fabricate a CMOS transistor of a surface channel type, which is capable of eliminate any variation in threshold voltage Vth.

Since the recessed portion 40 communicated to the diffusion layer 16 is embedded with the adhesion layer 32 and the tungsten 33 as a metal material, the resistance of the diffusion layer 16 can be reduced by the metal material thus embedded.

Further, since after the second recessed portions 40 are embedded with the metal material, the contact holes (not shown) communicated to the gate electrodes 34 are formed together with the contact holes 41, the depths of these contact holes are substantially equalized, to thereby make easy the control of the etching for formation of the contact holes. In general, when the contact holes are largely different in depth, there occurs a problem that etching suitable for a deeper contact hole causes over-etching for a shallower contact hole. In this embodiment, such a problem can be solved as described above.

Although description has been made of the fabrication process for a CMOS transistor in each of the previous embodiments, such description is for illustrative purposes only. For example, only the NchTr or PchTr, that is, a MOS transistor can be fabricated in accordance with the present invention.

As described above, according to the fabrication processes for a MOS transistor and a CMOS transistor according to the present invention, since each gate electrode is formed after formation of each diffusion layer the formation of which requiring heat treatment, each gate electrode; is never affected by heat treatment accompanied by formation of the diffusion layer or the like. This makes it possible to fabricate a MOS transistor or CMOS transistor of a surface channel type, which can of eliminate any variation in threshold voltage vth.

What is claimed is:

1. A fabrication process for a MOS transistor comprising:
    a first step of forming a gate electrode pattern made of silicon on a gate oxide film formed on a silicon substrate;
    a second step of doping an impurity in said silicon substrate using said gate electrode pattern as a mask, followed by activation of said doped impurity, to form a diffusion layer in a surface layer of said silicon substrate;
    a third step of forming an interlayer insulating film in such a manner as to cover said gate electrode pattern;
    a fourth step of removing an upper portion of said interlayer insulating film for exposing an upper portion of said gate electrode pattern;
    a fifth step of removing the exposed portion of said gate electrode pattern by selective etching; and
    a sixth step of embedding a metal material in a recessed portion formed by removal of the exposed portion of said gate electrode pattern by etching.

2. A fabrication process for a MOS transistor, comprising:
    a first step of forming a gate electrode pattern on a gate oxide film formed on a silicon base body, said gate electrode pattern formed by stacking silicon, a material having an etching selection ratio to silicon, and silicon in this order from said gate oxide film side;
    a second step of doping an impurity in said silicon base body using said gate electrode pattern as a mask, followed by activation of said doped impurity, to form a diffusion layer in a surface layer of said silicon base body;
    a third step of forming an interlayer insulating film in such a manner as to cover said gate electrode pattern;
    a fourth step of removing an upper portion of said interlayer insulating film to expose an upper portion of said gate electrode pattern;
    a fifth step of removing the silicon forming the upper layer of said gate electrode pattern thus exposed by selective etching;
    a sixth step of doping an impurity in the silicon of the lower layer of said gate electrode pattern, followed by activation of said doped impurity; and
    a seventh step of embedding a metal material in a recessed portion formed by removal of the silicon of the upper layer of said gate electrode pattern by etching;
    wherein said process further comprises, between said fifth step and said seventh step, a step of removing said material having an etching selection ratio to silicon of said gate electrode pattern by etching.

3. A fabrication process for a MOS transistor according to claim 2, wherein said process further comprises, between said fifth step and said sixth step, a step of etching said interlayer insulating film on said diffusion layer to form a second recessed portion communicated to said diffusion layer;
    said sixth step comprises a step of doping an impurity in the silicon of the lower layer of said gate electrode pattern and simultaneously doping the impurity in said diffusion layer through said second recessed portion; and
    said seventh step comprises a step of embedding a metal material in said recessed portion formed by removal of the silicon of the upper layer of said gate electrode pattern by etching and simultaneously embedding the metal material in said second recessed portion communicated to said diffusion layer.

4. A fabrication process for a MOS transistor according to claim 1, further comprising, between said fifth step and said sixth step, a step of doping an impurity in the surface layer of said silicon base body.

5. A fabrication process for a MOS transistor according to claim 2, further comprising, between said fifth step and said seventh step, a step of doping an impurity in the surface layer of said silicon base body.

6. A fabrication process for a CMOS transistor, comprising:

a first step of forming a PMOS region and an NMOS region on a silicon base body, and forming a gate oxide film on the surface of said silicon base body in each of said PMOS and NMOS regions;

a second step of forming a gate electrode pattern made of silicon on said gate oxide film formed on said silicon base body in each of said regions;

a third step of covering said NMOS region with a resist layer and doping a P-type impurity in said silicon base body in said PMOS region using said resist layer and said gate oxide pattern as a mask, covering said PMOS region with a resist layer and doping an N-type impurity in said silicon base body in said NMOS region using said resist layer and said gate electrode pattern as a mask, and activating the impurities thus doped, thereby forming diffusion layers in surface layers of said silicon base body in said NMOS and PMOS regions respectively;

a fourth step of forming an interlayer insulating film in such a manner as to cover said gate electrode patterns in said NMOS and PMOS regions;

a fifth step of removing an upper portion of said interlayer insulating film to expose an upper portion of each of said gate electrode patterns;

a sixth step of removing the exposed portion of each of said gate electrode patterns by selective etching; and a seventh step of embedding a metal material in a recessed portion formed by removal of the exposed portion of each of said gate electrode patterns. by etching.

7. A fabrication process for a CMOS transistor, comprising:

a first step of forming a PMOS region and an NMOS region on a silicon base body and forming a gate oxide film on the surface of said silicon base body in each of said regions;

a second step of forming a gate electrode pattern on said gate oxide film formed on the surface of said silicon base body in each of said regions, said gate electrode pattern being from by stacking silicon doped with no impurity, a material having an etching selection ratio to silicon, and silicon in this order from said gate oxide film side;

a third step of covering said NMOS region with a resist layer and doping a P-type impurity in said silicon base body in said PMOS region using said resist layer and said gate oxide pattern as a mask, covering said PMOS region with a resist layer and doping an N-type impurity in said silicon base body in said NMOS region using said resist layer and said gate electrode pattern as a mask, and activating impurities thus doped, thereby forming diffusion layers in surface layers of said silicon base body in said NMOS and PMOS regions respectively;

a fourth step of forming an interlayer insulating film in such a manner as to cover said gate electrode patterns in said PMOS and NMOS regions;

a fifth step of removing an upper portion of said interlayer insulating film to expose an upper portion of each of said gate electrode patterns;

a sixth step of removing the silicon of the upper layer of said gate electrode pattern thus exposed;

a seventh step of doping a P-type impurity in the silicon of the lower layer of said gate electrode pattern in said PMOS region, doping an N-type impurity in the silicon of the lower layer of said gate electrode pattern in said NMOS region, and activating the impurities thus doped; and an eighth step of embedding a metal material in a recessed portion formed by removal of the silicon of the upper layer of each of said gate electrode patterns by etching;

wherein said process further comprises, between said sixth step and said eighth step, a step of removing said material having an etching selection ratio to silicon of each of said gate electrode patterns by etching.

8. A fabrication process for a CMOS transistor according to claim 6, further comprising, between said sixth step and said seventh step, a step of doping a P-type impurity in the surface layer of said silicon base body in said PMOS region and doping an N-type impurity in the surface layer of said silicon base body in said NMOS region.

9. A fabrication process for a CMOS transistor according to claim 7, further comprising, between said sixth step and said eighth step, a step of doping a P-type impurity in the surface layer of said silicon base body in said PMOS region and doping an N-type impurity in the surface layer of said silicon base body in said NMOS region.

* * * * *

UNITED STATES PATENT AND TRADEMARK OFFICE
CERTIFICATE OF CORRECTION

PATENT NO.   : 6,001,698
DATED        : December 14, 1999
INVENTOR(S)  : Hideaki Kuroda It is certified that error appears in the above-identified patent and that said Letters Patent is hereby corrected as shown below:

<u>Column 13,</u>
Line 31 et seq., claim 7, line 1 et seq., should read as follows;
    7. A fabrication process for a CMOS transistor, comprising:
a first step of forming a PMOS region and an NMOS region on a silicon base body and forming a gate oxide film on the surface of said silicon base body in each of said regions;
    a second step of forming a gate electrode pattern on said gate oxide film formed on the surface of said silicon base body in each of said regions, said gate electrode pattern being formed by stacking silicon doped with no impurity, a material having an etching selection ratio to silicon, and silicon in this order from said gate oxide film side;
    a third step of covering said PMOS region with a resist layer and doping a P-type impurity in said silicon base body in said PMOS region using said resist layer and said gate oxide pattern as a mask, covering said NMOS region with a resist layer and doping an N-type impurity in said silicon base body in said NMOS region using said resist layer and said gate electrode pattern as a mask, and activating impurities thus doped, thereby forming diffusion layers in surface layers of said silicon base body in said NMOS and PMOS regions respectively.
    a fourth step of forming an interlayer insulating film in such a manner as to cover said gate electrode patterns in said PMOS and NMOS regions;
    a fifth step of removing an upper portion of said interlayer insulating film to expose an upper portion of each of said gate electrode patterns;
    a sixth step of removing the silicon of the upper layer of said gate electrode pattern thus exposed;
    a seventh step of doping a P-type impurity in the silicon of the lower layer of said gate electrode pattern in said PMOS region, doping an N-type impurity in the silicon of the lower layer of said gate electrode pattern in said NMOS region, and activating the impurities thus doped; and

UNITED STATES PATENT AND TRADEMARK OFFICE
CERTIFICATE OF CORRECTION

PATENT NO.   : 6,001,698
DATED        : December 14, 1999
INVENTOR(S)  : Hideaki Kuroda It is certified that error appears in the above-identified patent and that said Letters Patent is hereby corrected as shown below:

an eight step of embedding a metal material in a recessed portion formed by removal of the silicon of the upper layer of each of said gate electrode patterns by etching;
      wherein said process further comprises, between said sixth step and said eighth step, a step of removing said material having an etching selection ratio to silicon of each of said gate electrode patterns by etching.

Signed and Sealed this

Third Day of July, 2001

*Attest:*

*Attesting Officer*

NICHOLAS P. GODICI
*Acting Director of the United States Patent and Trademark Office*